United States Patent [19]
Seki et al.

[11] Patent Number: 5,719,812
[45] Date of Patent: Feb. 17, 1998

[54] SEMICONDUCTOR MEMORY INCLUDING BIT LINE RESET CIRCUITRY AND A PULSE GENERATOR HAVING OUTPUT DELAY TIME DEPENDENT ON TYPE OF TRANSITION IN AN INPUT SIGNAL

[75] Inventors: Teruo Seki, Kasugai; Akihiro Iwase, Kuwana; Shinzi Nagai, Toki, all of Japan

[73] Assignees: Fujitsu Limited, Kawasaki; Fujitsu VLSI Ltd., Kasugai, both of Japan

[21] Appl. No.: 718,014

[22] Filed: Sep. 3, 1996

Related U.S. Application Data

[63] Continuation of Ser. No. 495,373, Jun. 28, 1995, abandoned, which is a continuation of Ser. No. 175,189, Dec. 29, 1993, abandoned, which is a continuation of Ser. No. 821,874, Jan. 5, 1992, abandoned, which is a continuation of Ser. No. 435,874, Nov. 14, 1989, abandoned.

[30] Foreign Application Priority Data

Nov. 16, 1988 [JP] Japan ................ 63-289698
Nov. 16, 1988 [JP] Japan ................ 63-289699

[51] Int. Cl.[6] ........................... G11C 11/413
[52] U.S. Cl. .............. 365/194; 365/203; 365/233.5; 365/233; 365/227
[58] Field of Search ................ 365/194, 203, 365/233, 233.5, 227; 395/494, 550, 750

[56] References Cited

U.S. PATENT DOCUMENTS

| | | | |
|---|---|---|---|
| 4,592,026 | 5/1986 | Matsukawa et al. | 365/203 |
| 4,592,028 | 5/1986 | Konishi | 365/233.5 |
| 4,614,883 | 9/1986 | Sood et al. | 365/233.5 |
| 4,633,102 | 12/1986 | Childers | 365/233 |
| 4,706,218 | 11/1987 | Sodd | 365/189.05 |
| 4,744,063 | 5/1988 | Ohtani et al. | 365/233.5 |
| 4,766,571 | 8/1988 | Kawashima | 365/230.03 |
| 4,813,021 | 3/1989 | Kai et al. | 365/194 |
| 4,916,668 | 4/1990 | Matsui | 365/233 |
| 4,972,373 | 11/1990 | Kim et al. | 365/203 |
| 5,055,706 | 10/1991 | Nakai et al. | 327/288 |

FOREIGN PATENT DOCUMENTS 548-19793 2/1983 Japan.
63-21771 9/1988 Japan.

*Primary Examiner*—Glenn Gossage
*Attorney, Agent, or Firm*—Armstrong, Westerman, Hattori, McLeland & Naughton

[57] ABSTRACT

A semiconductor memory includes a power down pulse generating circuit having an output delay time which is dependent on the type of change or transition in an input signal. The pulse generating circuit generates a power down signal at different times depending on whether the input signal changes from a first level to a second level or from the second level to the first level to prevent the power down signal from being output twice when an input clock signal has a pulse width shorter than a normal pulse width thereof. The power down pulse generating circuit generates the power down signal in response to a signal from address transition detection circuitry, and causes data read/write circuitry and bit line pulse generating circuitry to become inactive to reduce power consumption. The bit line pulse generating circuitry generates reset signals which may be used to reset or precharge the bit lines at different timings to reduce peak current in the semiconductor memory.

4 Claims, 15 Drawing Sheets

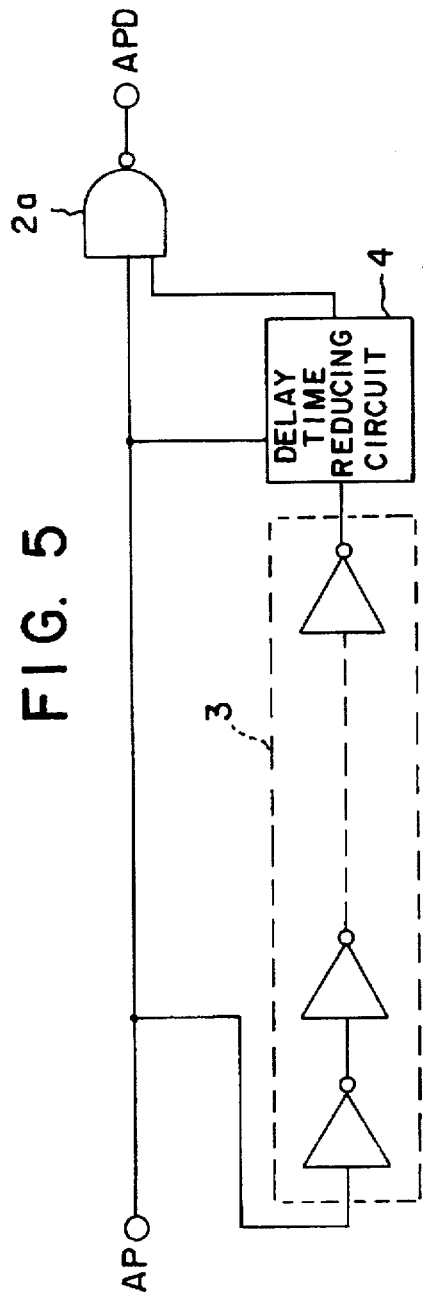
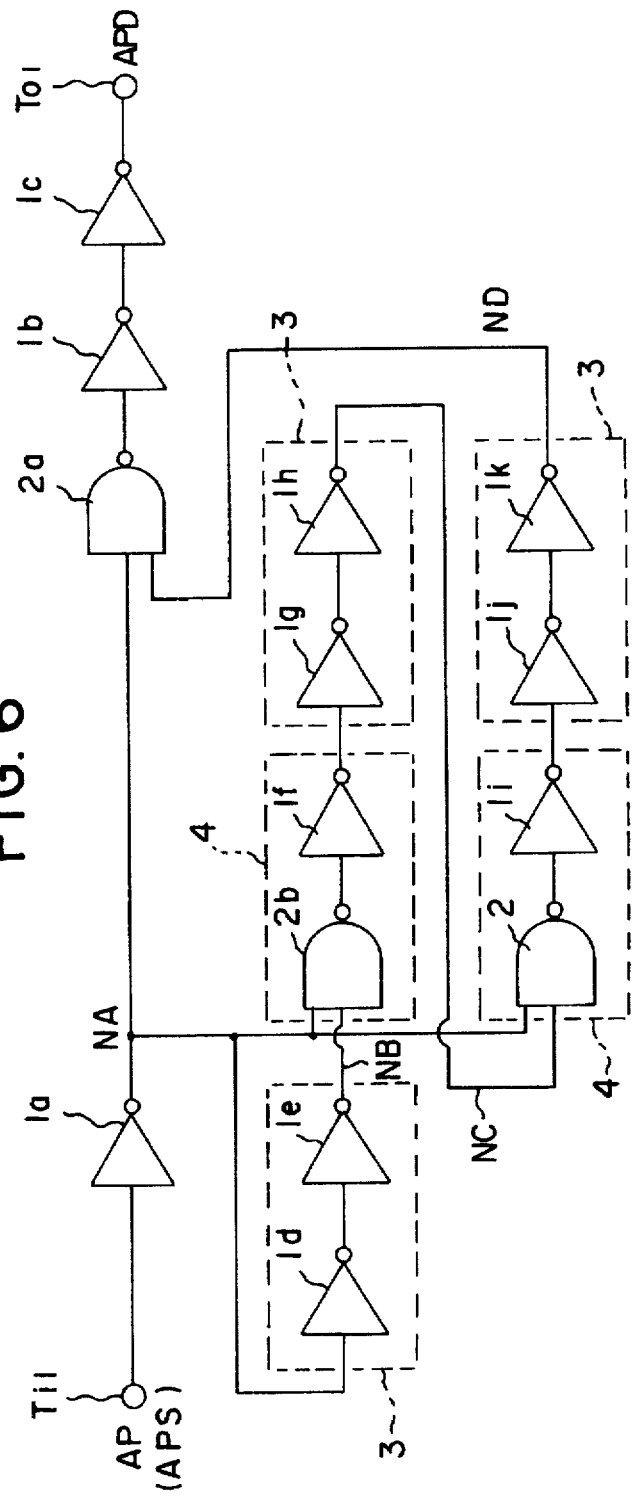
FIG. 5
FIG. 6

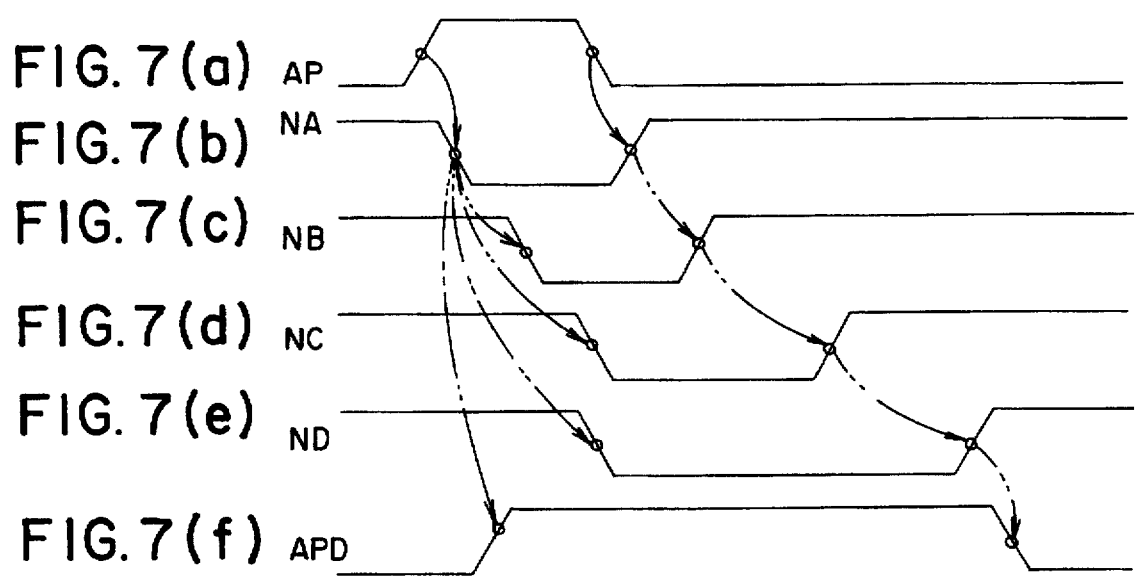
FIG. 7(a) AP
FIG. 7(b) NA
FIG. 7(c) NB
FIG. 7(d) NC
FIG. 7(e) ND
FIG. 7(f) APD
FIG. 8
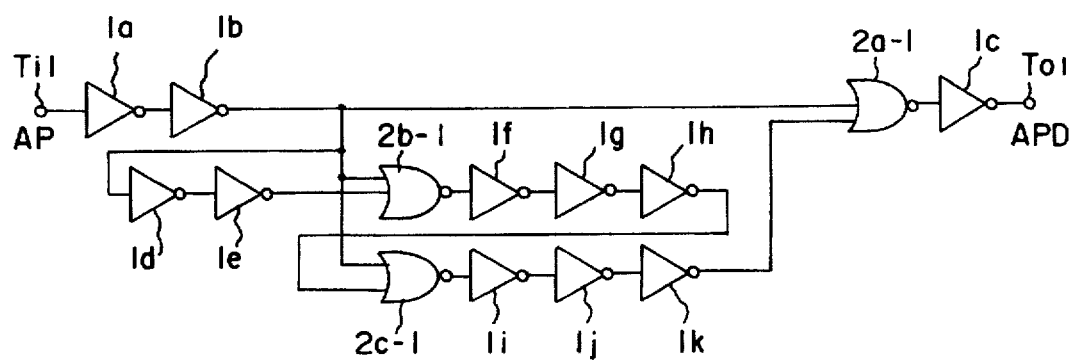

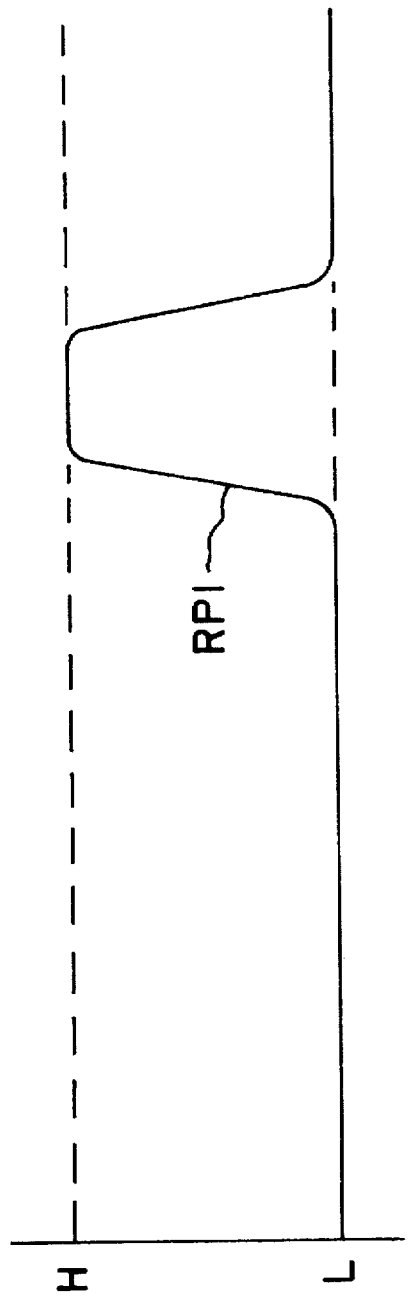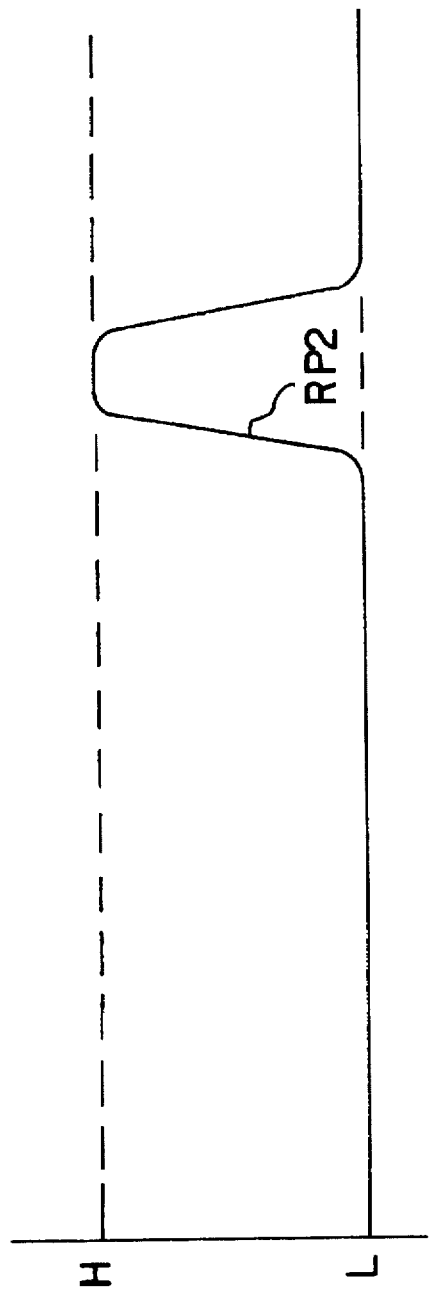
FIG. 17(b)1     FIG. 17(b)2

SEMICONDUCTOR MEMORY INCLUDING BIT LINE RESET CIRCUITRY AND A PULSE GENERATOR HAVING OUTPUT DELAY TIME DEPENDENT ON TYPE OF TRANSITION IN AN INPUT SIGNAL

This application is a continuation of U.S. patent application Ser. No. 08/495,373, filed Jun. 28, 1995, now abandoned, which is a continuation of application Ser. No. 08/175,189, filed Dec. 29, 1993, now abandoned, which is a continuation of application Ser. No. 07/821,874, filed Jan. 15, 1992, now abandoned, which is a continuation of application Ser. No. 07/435,874, filed Nov. 14, 1989, now abandoned.

BACKGROUND OF THE INVENTION

The present invention generally relates to a hysteresis circuit and, more particularly, a hysteresis circuit directed to reducing power consumption in a semiconductor memory device such as a static random access memory (SRAM).

Recently, a power consumption reducing circuit incorporated in a semiconductor memory such as an SRAM has been in practical use. Such a power consumption reducing circuit stops supplying power to a peripheral circuit (drive circuit, buffer circuit or the like) coupled to a memory cell array, during a time other than a time when data is written into a memory cell in the memory device or data is read out from a memory cell.

A conventional SRAM includes a clock signal generating circuit and a power consumption reducing circuit (hereinafter referred to as an automatic power-down circuit or simply referred to as an APD circuit). The clock signal generating circuit receives an address signal A shown in FIG. 1(a) indicative of a an address consisting of a row address and a column address, and generates a clock signal AP as shown in FIG. 1(b). In response to the clock signal AP, the APD circuit generates an output signal OUT2 (called an automatic power-down signal), as shown in FIG. 1(c), the level of which is maintained at a high (H) level during a constant time, that is, a time necessary to read out data from the memory cell array or write data in the memory cell array. During this time, the drive circuit (buffer circuit) is held active, and the content of a memory cell is read out as an output signal D1 or D2 as shown in FIG. 1(d), or a signal at a high or low (L) level is written into a memory cell. After the aforementioned constant time has passed, or in other words, when a data write or data read operation has been completed and when an address transition for the next data write or data read operation occurs, the output signal OUT2 derived from the APD circuit changes to the L level, and thus the drive circuit is made inactive so that power consumption of the memory can be reduced.

A conventional APD circuit is illustrated in FIG. 2. Referring to this figure, an input terminal Ti is an input terminal of an inverter (NOT circuit) 11 and the inverter 11 supplies an output signal to an input of a NAND circuit. The output terminal of the inverter 11 is also connected to an input terminal of a delay time generating circuit 13, which is made up of an even number of inverters coupled in series. An output terminal of the delay time generating circuit 13 is connected to the other input terminal of the NAND circuit 12.

When the clock signal Ap shown in FIG. 1(b) is applied to the input terminal Ti, the output signal of the APD circuit at output terminal 10 rises with a delay corresponding to the sum of operation speeds (delay times) of the inverter circuit 11 and the NAND circuit 12. After the clock signal AP changes to L level, the output signal of the APD circuit falls with a delay corresponding to the sum of operation speeds of the inverters provided by an even number of stages. Thus, a hysteresis time is generated. By the presence of the hysteresis time, as shown in FIG. 1(c), the output signal OUT2 is kept high by a hysteresis time $t_1$ after the clock signal Ap changes to L level. The drive circuit is being made active during the hysteresis time $t_1$ and data write or read is executed. The hysteresis time $t_1$ is adjusted so that the output signal OUT2 changes to L level after data write or read is completed. When the address changes, the derived circuit is held inactive. Thus, it is possible to reduce power consumption in the SRAM.

However, a conventional APD circuit such as described before has the following disadvantages. When an address transition instantaneously takes place, the clock signal generating circuit generates a pulse signal APS shown in FIG. 3(a), which has a pulse duration less than the delay time $t_1$ provided by the aforementioned delay time generating circuit 13 shown in FIG. 2. In this case, after the output signal of the inverter circuit 11 labeled N1 returns to H level (FIG. 3(b)), the output signal of the delay time generating circuit 13 labeled N2 changes to L level (FIG. 3(c)). Thus, as shown in FIG. 3(d), the output signal of the APD circuit changes to H level two times (the second level change is labeled OUT3). The number of such signal changes increases with an increase of the number of stages of inverters forming the delay time generating circuit 13, or in other words, with an increase of the hysteresis time. As a result, in the state where an address has been selected, the drive circuit is changed from the active state to the inactive state, and is then changed from the inactive state to the active state again. Such a change in the state of the drive circuit causes a malfunction of read or write operation of the SRAM.

SUMMARY OF THE INVENTION

Accordingly, a general object of the present invention is to provide an improved hysteresis circuit in which the aforementioned disadvantages are overcome.

A more specific object of the present invention is to provide a hysteresis circuit capable of providing a sufficient hysteresis time without causing a malfunction of read or write operation even when an instantaneous address transition occurs.

The above objects of the present invention are achieved by a hysteresis circuit comprising a logic gate having a first input terminal provided with an input signal, a second input terminal and an output terminal; delay means, coupled to the second input terminal of the logic gate, for providing the input signal with a delay time; and delay time reducing means, coupled to the delay means, for reducing the delay time when the input signal changes from a first level to a second level and for providing the delay time with no reduction when the input signal changes from the second level to the first level. An elongated signal of the input signal is output through the output terminal of the logic gate.

Another object of the present invention is to provide a semiconductor memory employing the aforementioned hysteresis circuit.

This object of the present invention is achieved by a semiconductor memory which includes a memory cell array having a plurality of memory cells arranged in an array; an address supply circuit, coupled to the memory cell array, for supplying the memory cell array with an address and generating a clock signal indicative of a transition of the address; a data read/write circuit, coupled to the memory cell array, for reading out data from the memory cell array and for writing data into the memory cell array; a generating circuit, coupled to the address supply circuit, for deriving a control signal from the clock signal supplied from the address supply circuit; and a controlling circuit, coupled to the data read/write circuit and the generating circuit, for making the data read/write circuit inactive when the control signal is supplied to the data read/write circuit. The generating circuit includes a logic gate having a first input terminal provided with the clock signal, a second input terminal and an output terminal; delay circuitry, coupled to the second input terminal of the logic gate, for providing the clock signal with a delay time; and delay time reducing circuitry, coupled to the delay means, for reducing the delay time when the clock signal changes from a first level to a second level and for providing the delay time with no reduction when the clock signal changes from the second level to the first level. The control signal is output through the output terminal of the logic gate of the generating circuit and is supplied to the data read/write circuit.

Additional objects, features and advantages of the present invention will become apparent from the following detailed description when read in conjunction with the accompanying drawings.

BRIEF DESCRIPTION OF THE DRAWINGS

FIG. 5 is a simplified schematic block diagram of the hysteresis circuit according to the present invention;

FIG. 6 is a circuit diagram of the hysteresis circuit according to a first embodiment of the present invention;

FIG. 7 is a waveform diagram of signals at part of the circuit shown in FIG. 6;

FIG. 8 is a circuit diagram of the hysteresis circuit according to a second embodiment of the present invention;

DESCRIPTION OF THE PREFERRED EMBODIMENTS

Figure 1:
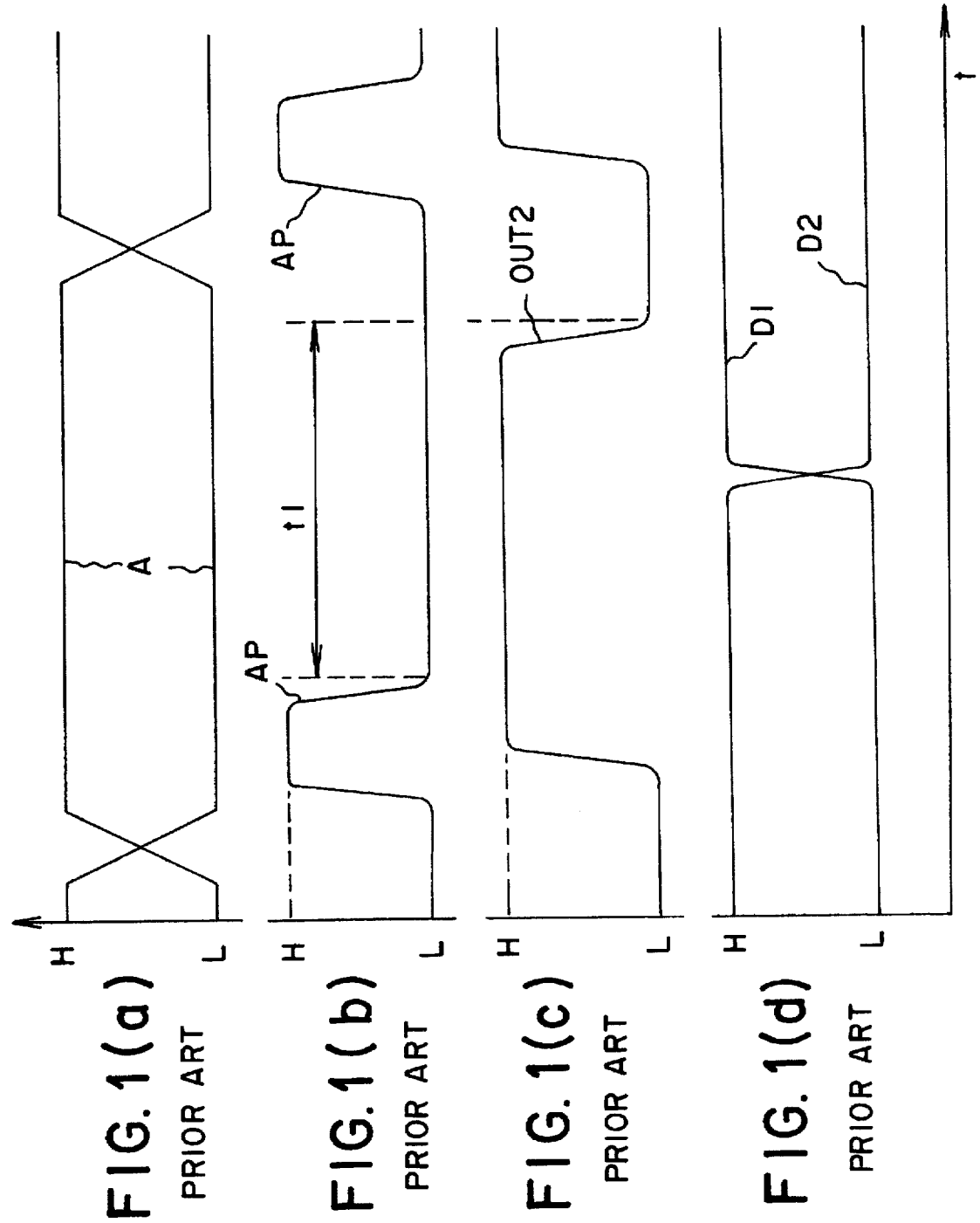
FIGS. 1(a)–1(d) are waveform diagrams of signals used in a conventional SRAM.
Figure 2:
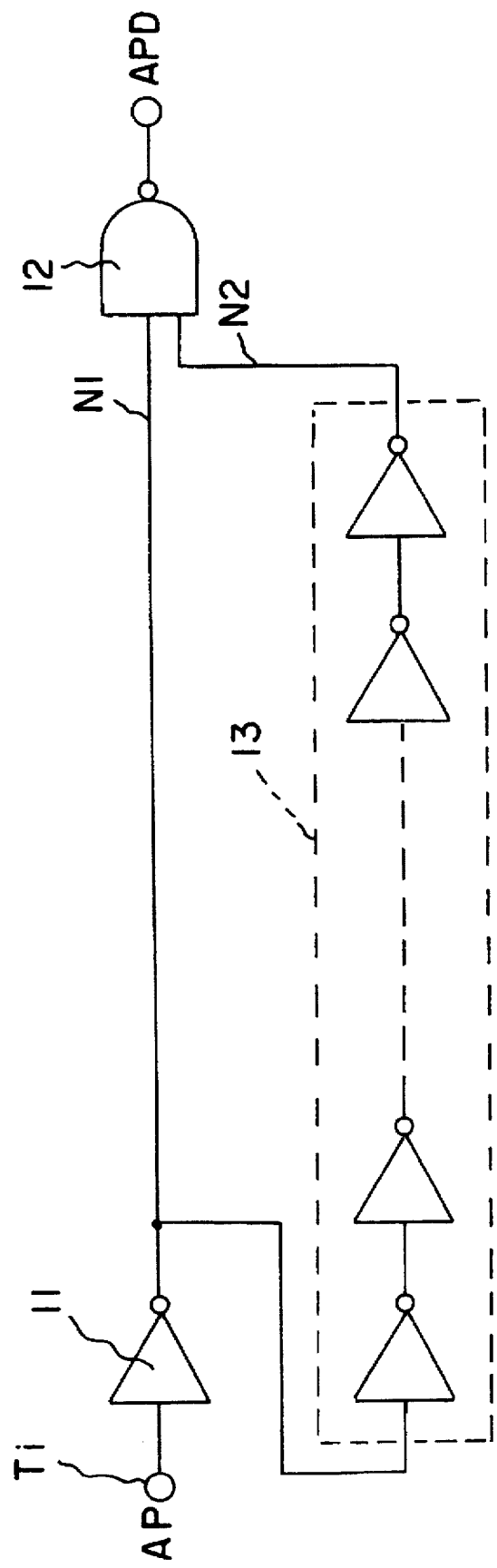
FIG. 2 is a circuit diagram of a conventional hysteresis circuit used in a conventional SRAM.
Figure 3:
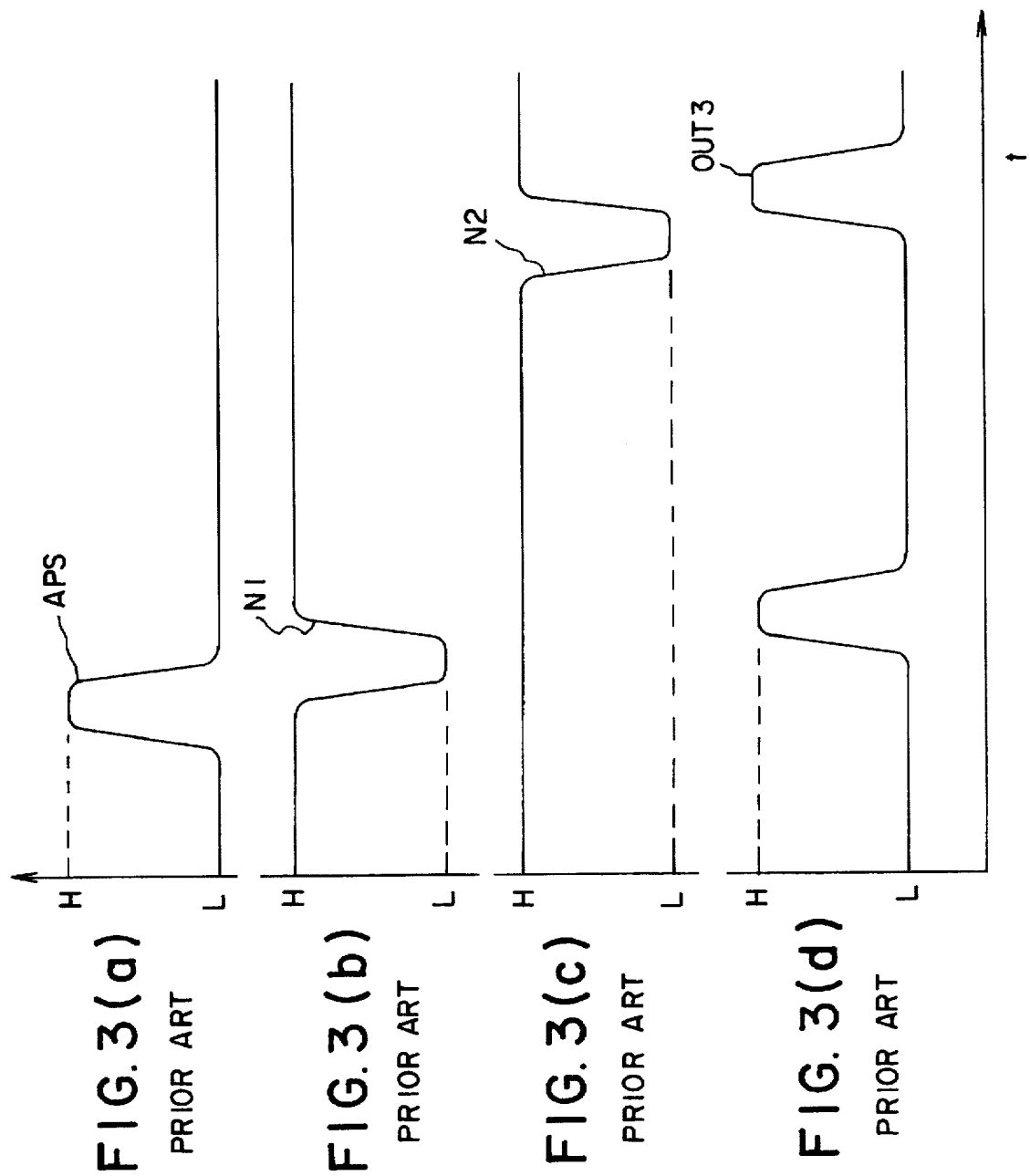
FIG. 3(a)–3(d) are waveform diagrams illustrating disadvantages of the conventional hysteresis circuit shown in FIG. 2.
Figure 4:
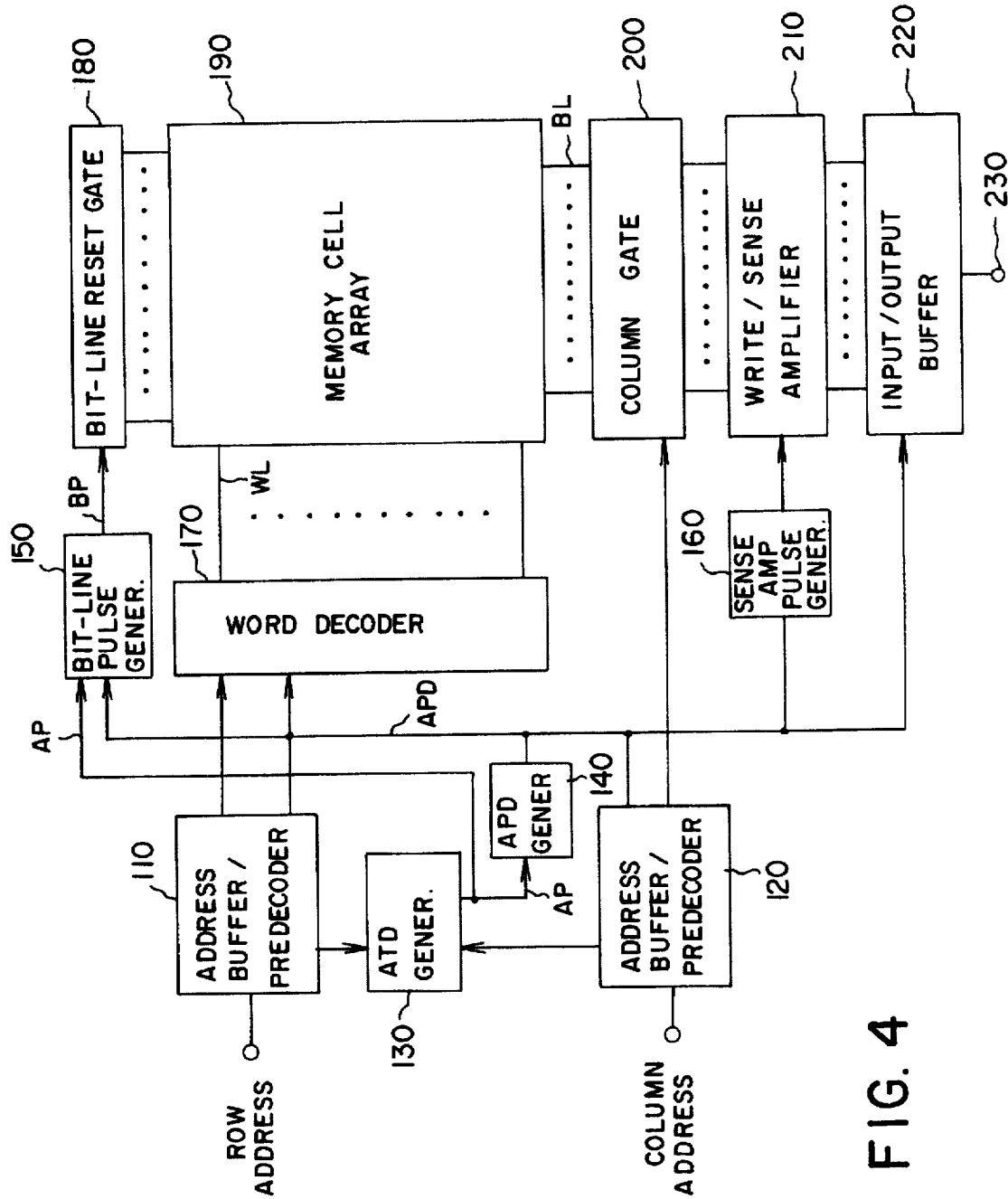
FIG. 4 is a block diagram of the entire structure of an SRAM which employs a hysteresis circuit (automatic power-down circuit) according to the present invention.

FIG. 4 is a block diagram of the entire structure of an SRAM which employs a hysteresis circuit according to the present invention. Referring to FIG. 4, the illustrated SRAM includes an address buffer/predecoder 110 relating to a row address, an address buffer/predecoder 120 relating to a column address, an address transition detection signal generator 130 (hereinafter simply referred to an ATD generator 130), and an automatic power-down pulse generator 140 (hereinafter simply referred to as an APD generator 140). Further, the SRAM includes a bit line pulse generator 150, a sense amplifier pulse generator 160, a word decoder 170, a bit line reset gate 180, a memory cell array 190, a column gate 200, a write/sense amplifier 210, and an input/output buffer 220.

The address buffer/predecoder 110 predecodes a row address signal supplied thereto from an external device by a predecoder part thereof, and generates a predecoded row address through an address buffer part thereof. The address buffer/predecoder 120 predecodes a column address signal thereto supplied from the external device by a predecoder part thereof, and generates a predecoded column address through an address buffer part thereof.

The ATD generator 130 derives a clock signal AP from the signals supplied from the address buffer/predecoders 110 and 120. The ATD generator 130 serves as the aforementioned clock signal generating circuit. The generated clock signal AP is supplied to the bit line pulse generator 150 and the APD generator 140. A configuration of the APD generator 140 according to the present invention will be described in detail later. The APD generator 140 derives an automatic power-down signal APD from the clock signal Ap (hereinafter referred to as a power-down signal APD). The generated power-down signal APD is supplied to the address buffer/predecoders 110, 120, the bit line pulse generator 150, the sense amplifier pulse generator 160, the input/output buffer 220 and the word decoder 170. When the power-down signal APD is being made active (L level), the above-indicated elements are being made inactive, so that power consumption caused therein can be reduced. On the other hand, when the address changes, the power-down signal APD switches to H level and the above-mentioned peripheral circuits are made active.

The bit line pulse generator 150 derives a bit line pulse signal from the clock signal Ap supplied from the ATD generator 130. The bit line reset gate 180 includes a reset gate provided for each of the bit lines which extend in the memory cell array 190. The reset gates of the bit line reset gate 180 are controlled by the bit line pulse signal supplied from the bit line pulse generator 150. When the bit line pulse signal is supplied to the bit line reset gate 180, the corresponding reset gates reset the bit lines (short-circuit the bit lines and connect them to a power source voltage Vcc, for example). The word decoder 170 decodes the predecoded row address supplied from the address buffer/predecoder 110 and generates a word line select signal having a plurality of bits, which are supplied to word lines extending in the memory cell array 190.

The column gate 200 is supplied with the predecoded column address signal from the address buffer/predecoder 120. The column gate 200 includes gates which are provided for the bit lines and controlled by the predecoded column address signal. The write/sense amplifier 210 is controlled by the sense amplifier pulse generator 160, which derives a sense amplifier pulse signal from the power-down signal APD supplied from the ATD generator 130. The input/output buffer 220 is interposed between an input/output terminal 230 and the write/sense amplifier 210, and is controlled by the power-down signal APD. When data is read out from the memory cell array 190, the write/sense amplifier 210 is made active by the sense amplifier pulse signal from the write/sense amplifier 210. In this case, data passes through the column gate 200, and is then amplified by the write/sense amplifier 210.

This amplification operation is done by increasing a potential difference between a pair of bit lines. Then the amplified potential difference is supplied to an external device through the input/output terminal 230 which device is held active by the power-down signal APD. On the other hand, when data is written into the memory cell array 190, the data passes through the input/output terminal 230 and the input/output buffer 220, and is amplified by the write/sense amplifier 210. Then the amplified data is supplied to the memory cell array 190 through the column gate 200.

A description is given of a cofiguration of the APD generator 140 which employs the hysteresis circuit according to an embodiment of the present invention. Referring to FIG. 5, there is schematically illustrated the APD generator 140. One of two input terminals of a NAND circuit 2a is directly supplied with the clock signal AP supplied from the ATD generator 130. The clock signal AP is supplied to a delay time generating circuit 3 which consists of an even number of inverters. An output terminal of the delay time generating circuit 3 is connected to a delay time reducing circuit 4, to which the aforementioned clock signal AP is directly supplied. The delay time generating circuit 3 delays the clock signal AP by a predetermined delay time. An output terminal of the delay time reducing circuit 4 is connected to the other input terminal of the NAND circuit 2a. The delay time reducing circuit 4 reduces the delay time provided by the delay time generating circuit 3 when the clock signal AP rises. The delay time reducing circuit 4 does not reduce the delay time when the clock signal AP falls.

FIG. 6 is a circuit diagram of a detailed configuration of the APD generator 140. Referring to FIG. 6, an inverter 1a, a NAND circuit 2a, and two inverters 1b and 1c are connected in series in this order between an input terminal Ti1 and an output terminal To1. Inverters 1d, 1e, a NAND circuit 2b, inverters 1f, 1g, 1h, a NAND circuit 2c, and inverters 1i, 1j and 1k are connected in series in this order between the inverter 1a and the other input terminal of the NAND gate 2a. The other terminals of the NAND circuits 2b and 2c are connected directly to the output terminal of the inverter 1a. Three sets of two-stage inverter circuits (inverters 1d and 1e, inverters 1g and 1h, and inverters 1j and 1k) form the delay time generating circuit 3. NAND/inventor pairs (a first pair being the NAND circuit 2b and inverter 1f, and a second pair being the NAND circuit 2c and inverter 1i) form the delay time reducing circuit 4.

An operation of the circuit shown in FIG. 6 is described below with reference to FIG. 7. As shown in waveform (a) of FIG. 7, when H level of the clock signal AP having a normal pulse width is supplied to the input terminal Ti1 from the ATD generator 130, the inverter 1a outputs a signal NA at L level as shown in waveform (b) of FIG. 7 Thus the NAND circuit 2a outputs a H-level signal independently of whether the output signal of whether the inverter 1k is at H level or L level. Hence, as shown in waveform (f) of FIG. 7, the clock signal AP is delayed by a time corresponding to the sum of the operation speeds of the inverter 1a, the NAND circuit 2a, and the inverters 1b, 1c, and appears (rises) at the output terminal To1. When the clock signal AP changes to L level from H level as shown in waveform (a) of FIG. 7, the output signal NA of the inverter 1a becomes L level as shown in waveform (b) of FIG. 7. When both the input terminals of the NAND circuit 2a change to H level, the H-level output signal is derived from the output terminal of the NAND circuit 2a. As shown in waveforms (e) and (f), of FIG. 7 a change of an output signal ND of the inverter 1k from L level to H level is delayed by a time corresponding to the sum of the operation speeds of the inverters 1d–1k and the NAND circuits 2b, 2c after the output signal NA of the inverter 1a changes to H level. Thus, as shown in waveform (f), of FIG. 7, the output terminal To1 is held high by a delay time corresponding to the above-mentioned sum of the operation speeds, so that the power-down signal APD which is an elongated signal of the clock signal Ap is available at the output terminal To1.

On the other hand, if the clock signal AP shown in waveform (a), of FIG. 7 has an extremely short pulse width, the inverter 1a changes the output signal NA waveform (b) of FIG. 7 from H level to L level. Subsequently, the NAND circuits 2b and 2c generate H-level signals independently of the levels of the signals NB and NC (waveforms (c) and (d) of FIG. 7) derived from the inverters 1e and 1h, respectively. The NAND circuit 2a is supplied with the output signal ND at a low level L which has been delved by a time corresponding to the sum of the operation speeds of the NAND circuit 2c and the inverters 1i–1k. Thus, as shown in waveform (f), of FIG. 7, the H-level output signal APD appears at the output terminal To1. In this state, even if the clock signal AP changes to L level and thus the output signal NA derived from the inverter 1a changes to H level, the output signal ND of the inverter circuit 1k is maintained at L level, so that the output signal APD at the output terminal To1 is maintained at H level.

As shown in waveform (e), of FIG. 7, when the output signal ND of the inverter 1k changes to H level with a delay corresponding to the sum of the operation speeds of the inverters 1d–1k and the NAND circuits 2b, 2c, the output signal APD of the output terminal To1 returns to L level as shown in waveform (f) of FIG. 7. In the aforementioned operation, the clock signal APD must be maintained at H level during a time longer than a delay time corresponding to at least the sum of the operation speeds of the NAND circuit 2c and the inverters 1i–1k.

As described above, with respect to a normal pulse duration (pulse width) of the clock signal AP, the circuit shown in FIG. 6 generates a hysteresis time corresponding to the sum of the operation speeds of the inverters 1d–1k and the NAND circuits 2b, 2c. Further, the delay time reducing circuit 4 functions to reduce the delay time necessary for the output signal ND derived from the final stage of the delay time generating circuit 3 to rise. When the output signal NA of the inverter 1a changes from L level to H level in response to even a short pulse width of the clock signal AP, the output signal ND of the inverter 1k is changed to L level so that the level of the output terminal To1 can be maintained at H level. With this structure, the output signal of the terminal To1 cannot be changed to H level two times even when the clock signal AP has a short pulse width, and it becomes possible to prevent the SRAM from malfunctioning.

FIG. 8 is a circuit diagram of a second configuration of the APD generator 140. The configuration shown in FIG. 8 is different from the configuration shown in FIG. 6 in that NOR circuits 2a-1, 2b-1 and 2c-1 are substituted for the NAND circuits 2a, 2b and 2c shown in FIG. 6. The clock signal AP passes through inverters 1a and 1b, and is supplied to one of two input terminals of the NOR circuit 2a-1. The circuit shown in FIG. 8 operates in the same manner as the circuit shown in FIG. 6.

Figure 9:
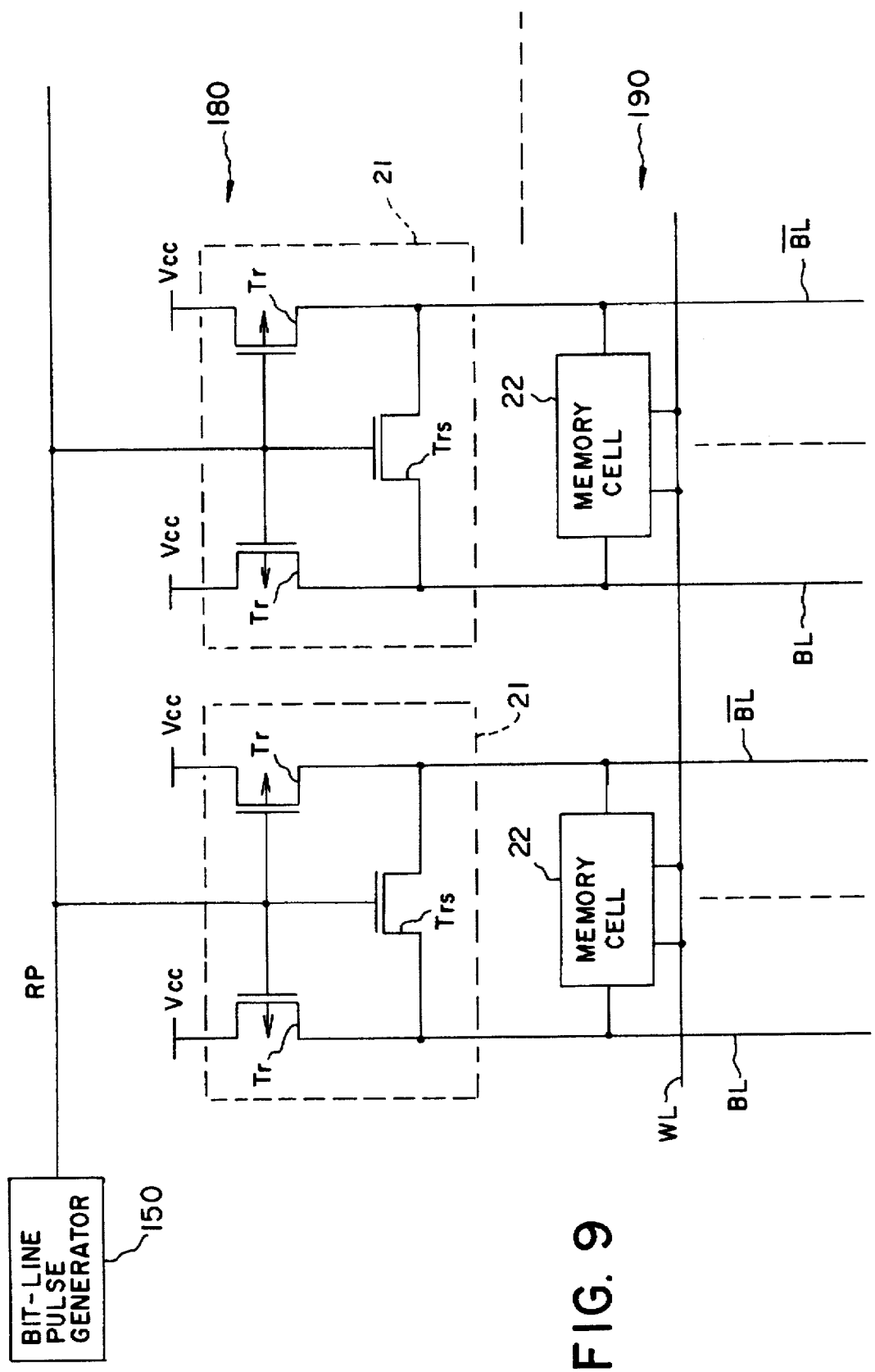
FIG. 9 is a block diagram of a peripheral circuit of a memory cell array shown in FIG. 4.
Figure 10:
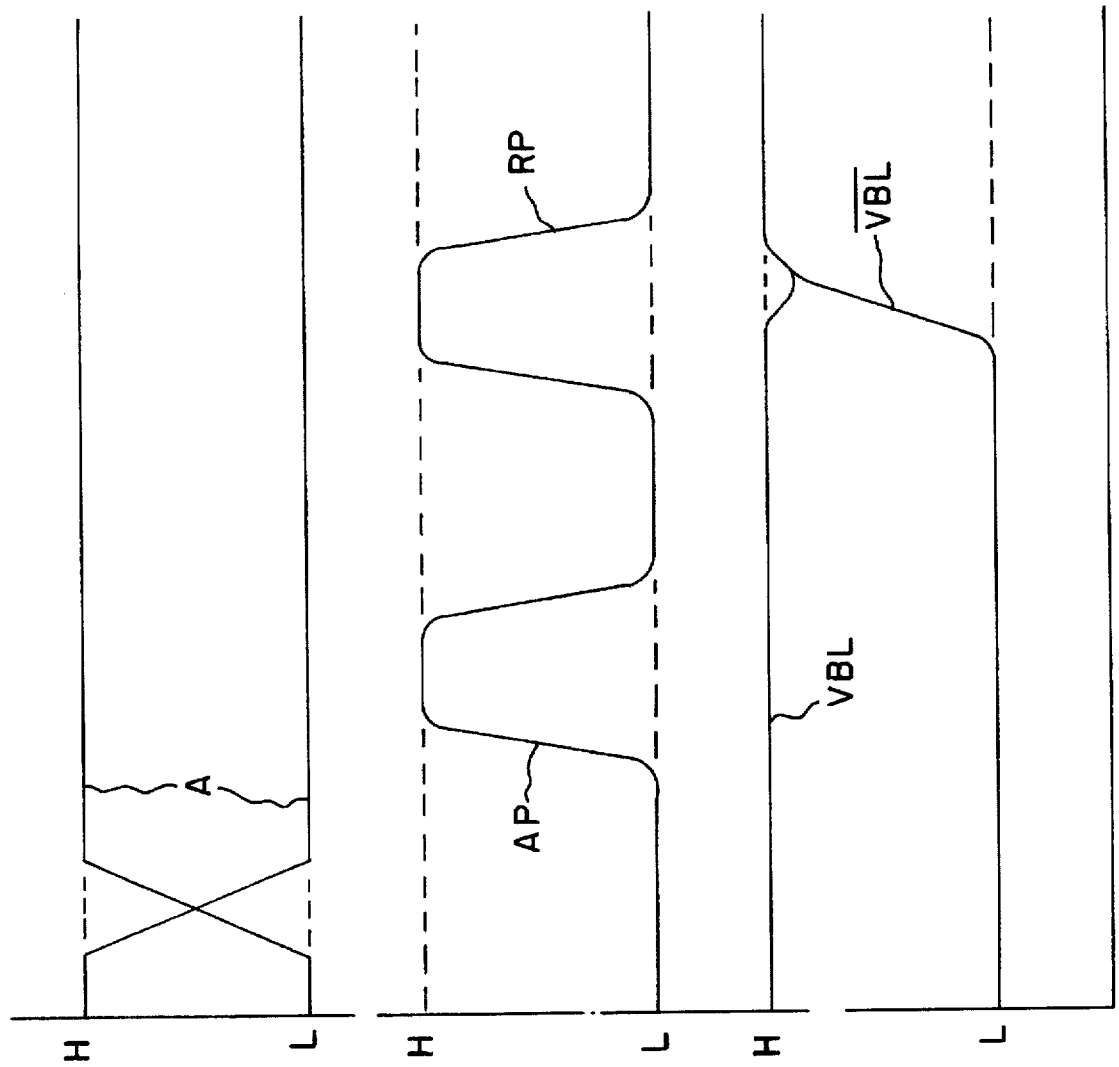
FIG. 10(a)–10(c) are waveform diagrams of signals at parts of the configuration shown in FIG. 9.

The structural elements shown in FIG. 4 other than the APD generator 140 can be formed by conventional structural elements. For example, the bit-line reset gate 180 and a part of the memory cell array 190 are illustrated in FIG. 9. The bit-line reset gate 180 short-circuits each of pairs of bit lines BL and $\overline{BL}$ before a data read or write to thereby reset the bit lines. The bit-line reset gate 180 includes a reset gate 21 provided for each of the pairs of bit lines BL and $\overline{BL}$. Each reset gate 21 includes a pair of MOS transistors Tr of P-channel type and an MOS transistor Trs of P-channel type. A power source voltage Vcc is supplied to the pair of bit lines BL and $\overline{BL}$ through the pair of transistors Tr. The transistor Trs is provided between the pair of bit lines BL and $\overline{BL}$. The gates of the transistors Tr and Trs are supplied with a reset pulse signal RP derived from the bit-line pulse generator 150. As shown in FIGS. 10(a) and 10(b), the bit-line pulse generator 150 derives the reset pulse signal RP from the clock signal AP generated in response to an address transition A by the ATD generator 130 shown in FIG. 4. When the reset pulse RP is supplied to the reset gates 21, the transistors Tr and Trs turn ON so that the potential of each of the bit lines BL and $\overline{BL}$ increases to the power source voltage Vcc. In this state, data is written into memory cells 22. Alternatively, it is possible to turn ON only the transistor Trs so that the potential of each of the bit lines BL and $\overline{BL}$ increases to Vcc/2.

Figure 11:
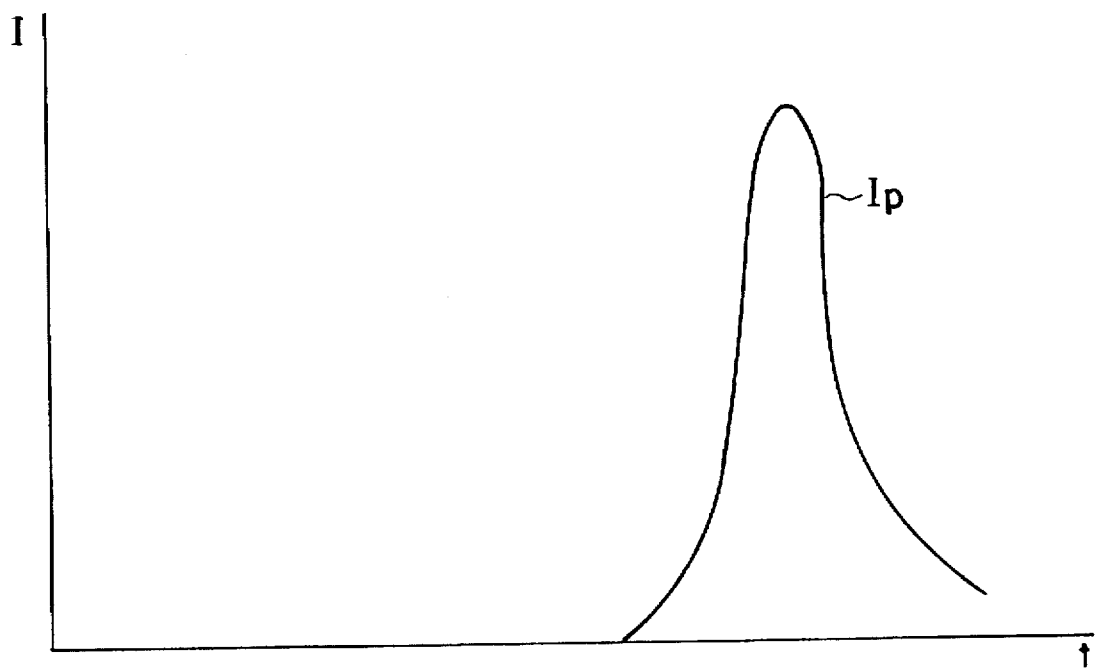
FIG. 11 is a graph illustrating a peak current caused when the configuration shown in FIG. 9 is employed.

However, the reset pulse RP is supplied to all the columns of the memory cell array 190 at the same time. Thus, as shown in FIG. 10(c), the potential $\overline{VBL}$ of the bit line $\overline{BL}$ increases at the same time in a large number of columns. At the same time, a current passes through the transistor Trs so that a peak current Ip passes through the entire SRAM as shown in FIG. 11. In synchronism with the occurrence of the peak current Ip, the power source voltage Vcc decreases transiently. The transient decrease of the power source voltage Vcc causes a malfunction of the SRAM.

Figure 12:
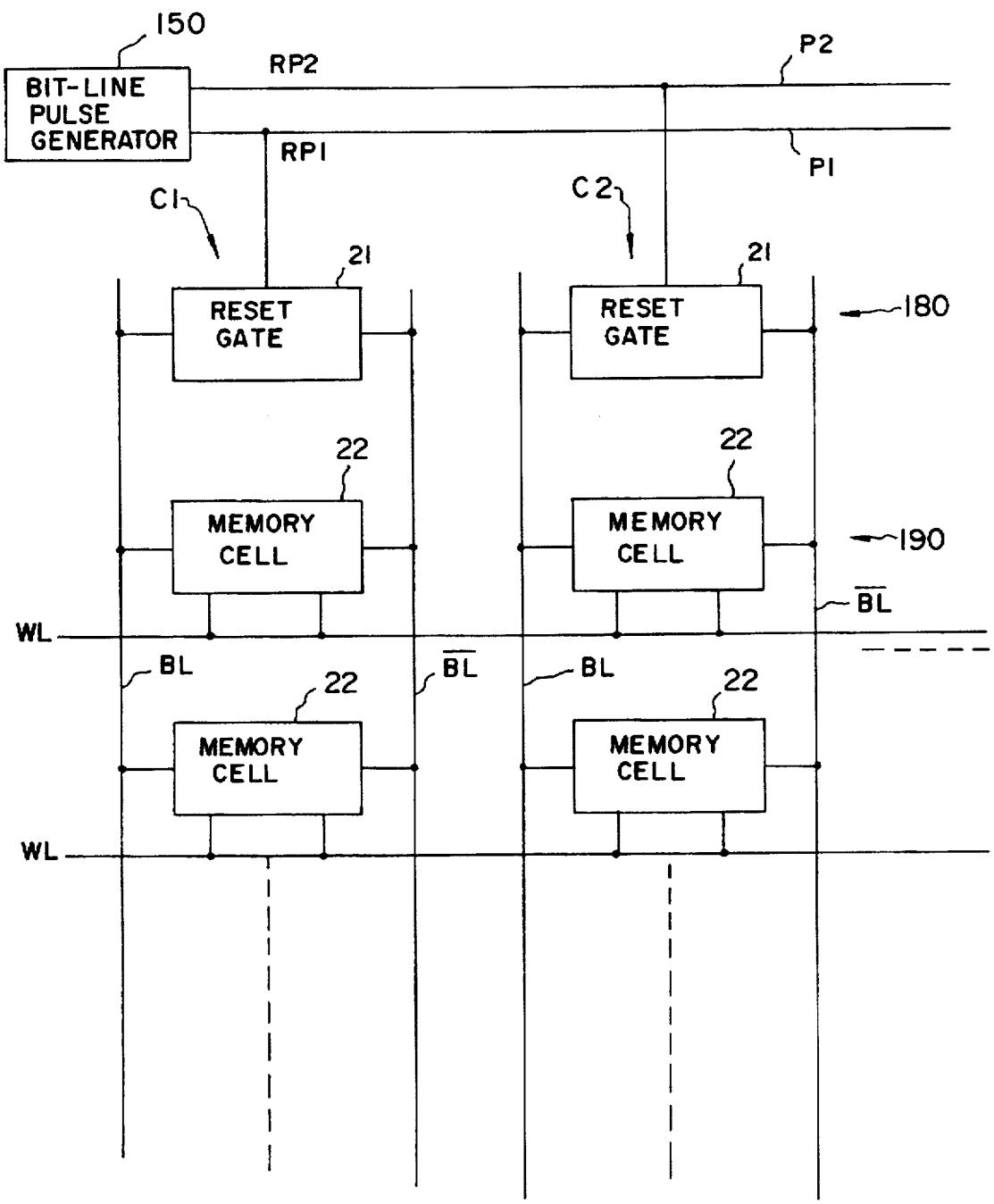
FIG. 12 is a block diagram of a preferable bit-line pulse generator coupled to a bit-line reset gate used in the configuration shown in FIG. 4.

From the above-mentioned viewpoints, it is preferable to form peripheral circuits of the memory cell array 190 as shown in FIG. 12. Referring to FIG. 12, the bit-line pulse generator 150 has at least two reset lines P1 and P2 and generates at least two reset pulse signals RP1 and RP2 which have a mutually different phase. Each of the columns or pairs of bit lines is coupled to either the reset line P1 or P2. In this manner, one group of bit lines is coupled to the reset line P1 and another group of bit lines is coupled to the reset line P2. In FIG. 12, a column C1 is coupled to the reset line P2, and a column C2 is coupled to the reset line P1. For example, half of the columns is coupled to the reset line P1, and the remaining columns are coupled to the reset line P2. A pair of bit lines BL and $\overline{BL}$ of the column C1 is short-circuited at a timing different from a timing at which a pair of bit lines BL and $\overline{BL}$ of the column C2 is short-circuited. Thus, short-circuit currents pass through the SRAM at different timings so that they are dispersed on the time base.

Figure 13:
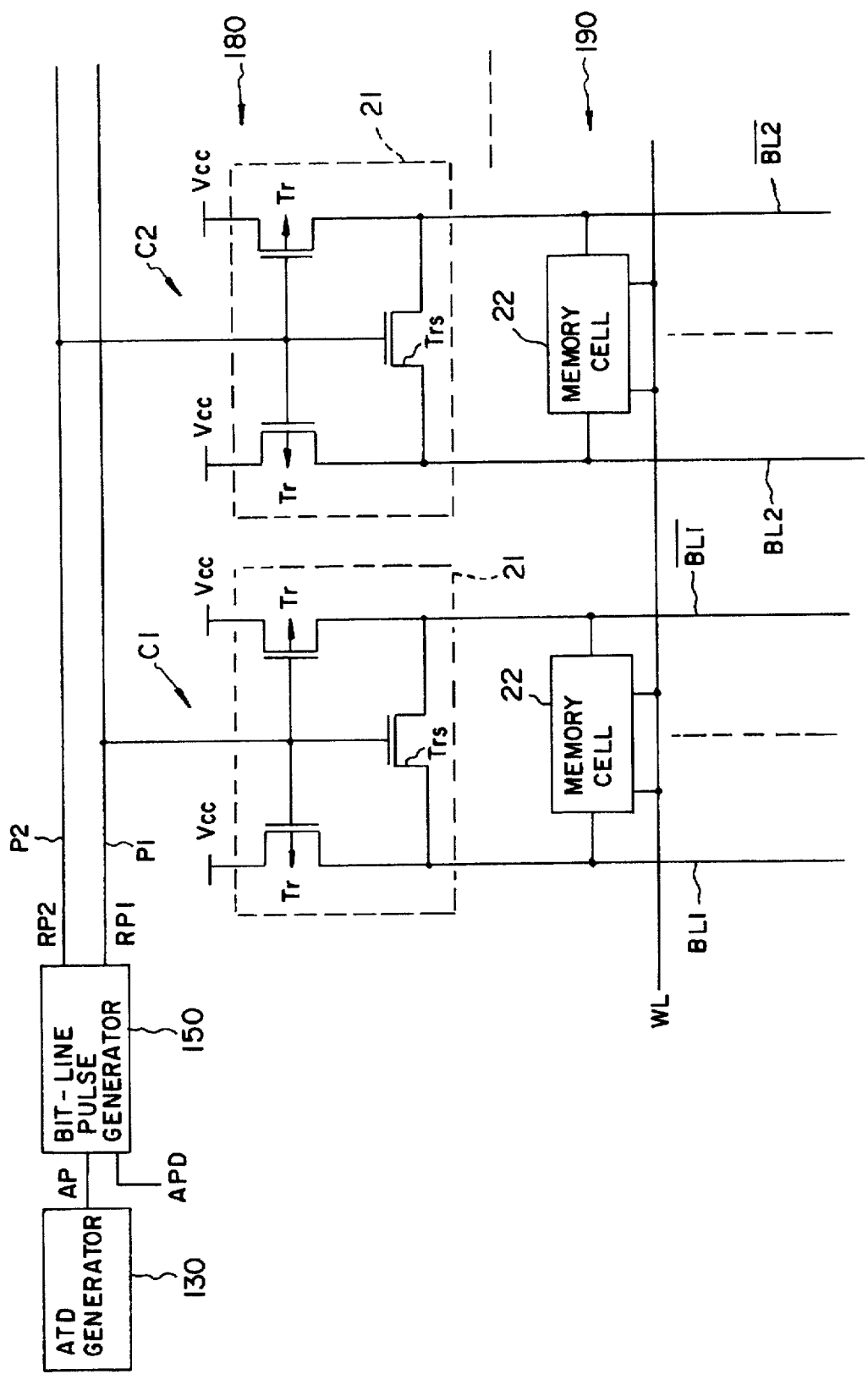
FIG. 13 is a block diagram of a detailed configuration of the bit-line pulse generator and the bit-line reset gate.

FIG. 13 is a block diagram of a detailed configuration of a bit-line pulse generator and a bit-line reset gate. The bit-line pulse generator 150 derives the reset pulses RP1 and RP2 having a mutually different phase from the clock signal AP supplied from the ATD generator 130 when the power-down signal APD is being made inactive (H-level). The reset pulse RP1 is applied to the gates of the transistors Tr and Trs of the reset gate 21 of the column C1. Similarly, the reset pulse RP1 is applied to the reset gates 21 of columns associated with the reset line P1. The reset pulse RP2 is applied to the gates of the transistors Tr and Trs of the reset gate 21 of the column C2. Similarly, the reset pulse RP2 is applied to the reset gates 21 of columns associated with the reset line P2.

When the configuration of FIG. 13 is employed, it is preferable to configure the address buffer/predecoders 110, 120, the ATD generator 130, and the bit-line pulse generator 180 as follows.

Figure 14:
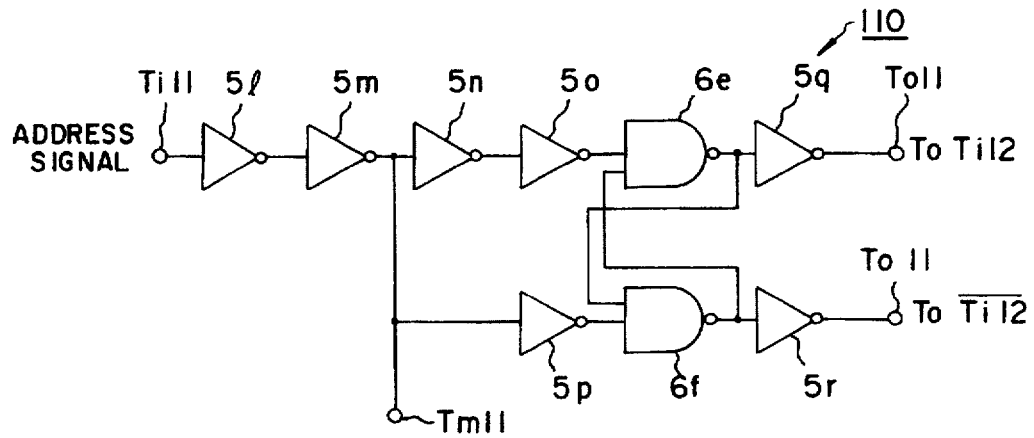
FIG. 14 is a circuit diagram of an address buffer part incorporated in an address buffer/predecoder shown in FIG. 4.
Figure 17A:
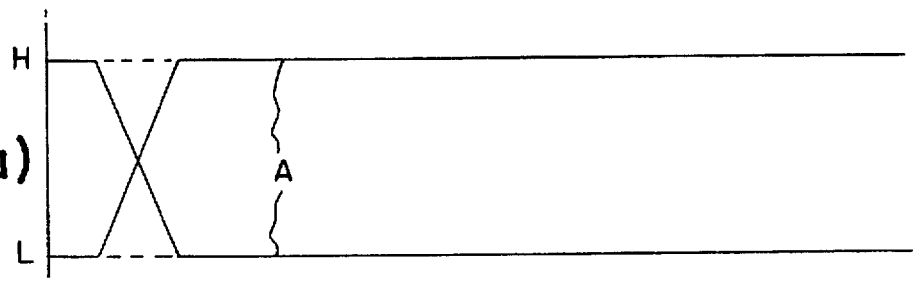
FIGS. 17(a)–17(d) waveform diagrams of signals at parts of the configuration shown in FIG. 13.

FIG. 14 is a circuit diagram of the address buffer part of the address buffer/predecoder 110. The illustrated circuit is provided for each of the bits forming the row address. The address buffer part of the address buffer/predecoder 120 is formed in the same manner. The aforementioned address signal A is applied to an input terminal Ti11. The address signal A is generated in a conventional manner. The address buffer part is made up of inverters 5l, through 5r, and NAND circuits 6e, 6f. With respect to one input terminal Ti11, the circuit has two output terminals and $\overline{To11}$, through which a pair of address signals is output. There is a 180° phase difference between the address signals through the output terminals To11 and $\overline{To11}$. This phase difference is based on a difference between the number of inverters between the input terminal Ti11 and the output terminal and the number of inverters between the input terminal Ti11 and the output terminal $\overline{To11}$. When the address signal A as shown in FIG. 17(a) is applied to the input terminal Ti11, a H-level address is output through one of the output terminals To11 and $\overline{To11}$, and a L-level address signal is output through the other output terminal. A pair of address signals for one bit of the row address is supplied to the word decoder 170 (FIG. 4) together with other pairs of address signals. Then the word decoder 170 selects a corresponding one of the word lines WL. The address signal A applied to the input terminal Ti11 passes through the inverters 5l and 5m, and is output through a terminal Tm11 with a delay of time equal to the sum of operation speeds of these inverters.

Figure 15:
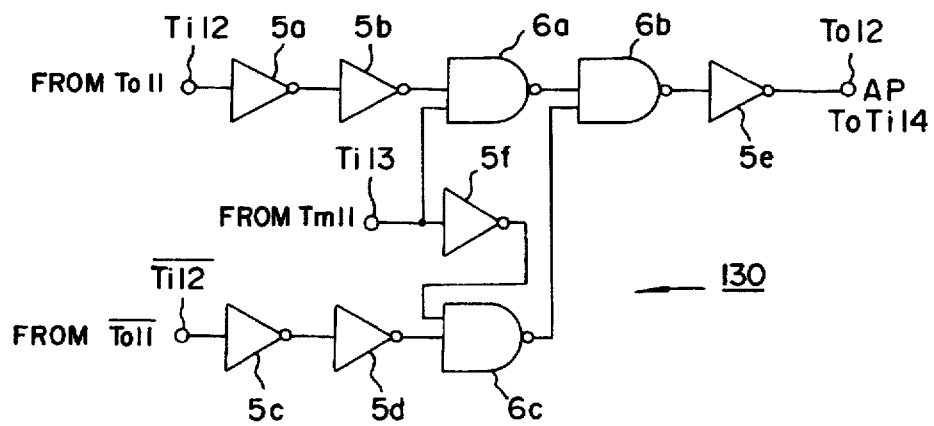
FIG. 15 is a circuit diagram of an address transition detection signal generator used in the configuration shown in FIG. 4.

FIG. 15 is a circuit diagram of the ATD generator 130. The illustrated circuit has two input terminals Ti12 and $\overline{Ti12}$, which are connected to the output terminals To11 and $\overline{To11}$ shown in FIG. 14, respectively. The input terminal Ti12 is coupled to one of two input terminals of a NAND circuit 6b through inverters 5a, 5b and a NAND circuit 6a. The output terminal $\overline{Ti12}$ is coupled to the other input terminal of the NAND circuit 6b through inverters 5c, 5d and a NAND circuit 6c. The output terminal of the NAND circuit 6b is coupled to an output terminal To12 through an inverter 5e. An input terminal Ti13 is connected to the terminal Tm11 shown in FIG. 14, and is connected directly to the other input terminal of the NAND circuit 6a, and connected to the other input terminal of the NAND circuit 6c through an inverter 5f. Each time the address signal A is applied to the address buffer part shown in FIG. 14, due to the function of the address buffer part, the input terminal Ti13 is supplied with the input signal having the inverse phase as the input (address) signal applied to the input terminal Ti12. When a constant time has passed, the input signals applied to the input terminals Ti12 and Ti13 has the same phase as each other. Thus, the ATD generator 130 shown in FIG. 15 generates the clock signal AP for every address transition. The clock signal AP formed for each address bit passes through an OR gate (not shown), and is supplied to the APD generator 140.

Figure 16:
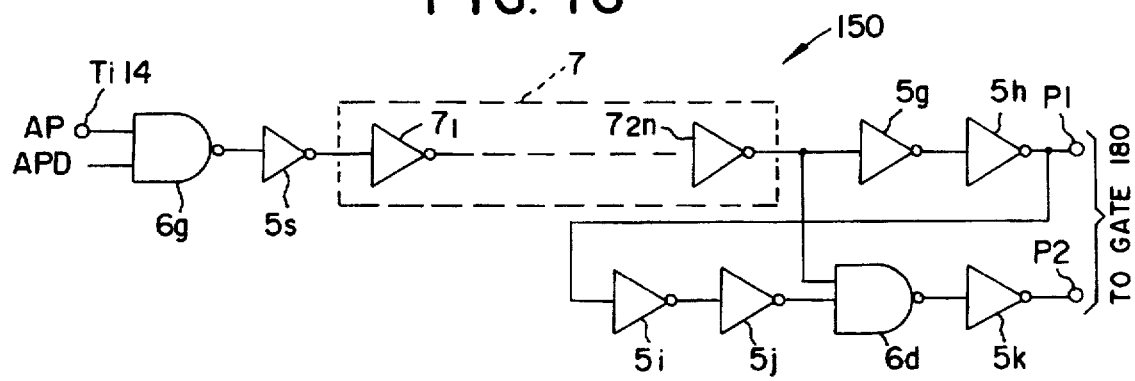
FIG. 16 is a circuit diagram of a bit-line pulse generator used in the configuration shown in FIG. 4.

FIG. 16 is a circuit diagram of the bit-line pulse generator 150 which generates the aforementioned reset pulse signals RP1 and RP2. The clock pulse AP derived from the ATD generator 130 shown in FIG. 15 is applied to a NAND circuit 6g, to which the aforementioned power-down signal APD derived from the APD generator 140 is also applied. The output signal of the NAND circuit 6g is supplied to a delay circuit 7 through an inverter 5s. The delay circuit 7 consists of an even number of inverters $7_1$–$7_{2n}$ (n is an integer). An output terminal of the delay circuit 7 is coupled to an output terminal P1 connected to the aforementioned reset line P1 through inverters 5g and 5h. The output terminal of the inverter 5h is coupled to one of two input terminals of a NAND circuit 6d through inverters 5i and 5j. The other input terminal of the NAND circuit 6d is connected to the output terminal of the delay circuit 7. Alternatively, it is possible to directly supply the delay circuit 7 with the clock signal AP without using the NAND gate 6g.

Figure 17B:
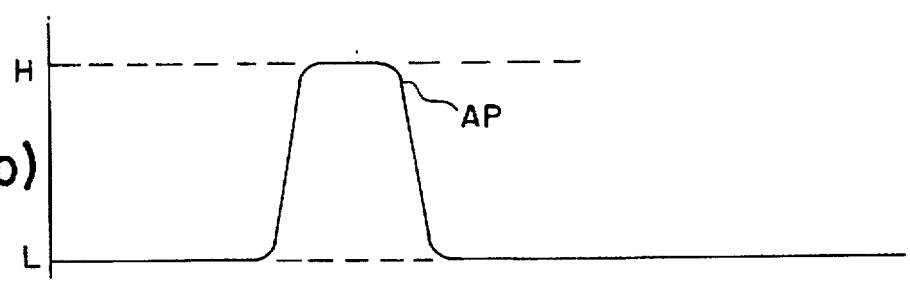

While the power-down signal APD is made inactive (H, level), no bit line pulse is generated by the bit-line pulse generator 150. On the other hand, when the power-down signal APD is kept active (L level) and the clock signal AP (FIG. 17(b)) is applied to the NAND circuit 6g, the reset pulse signal RP1 is generated through the output terminal P1 with a delay corresponding to the sum of operation speeds of the delay circuit 7 and the NAND circuit 6d. Further, the reset pulse signal RP2 is generated through the output terminal P2 with a delay corresponding to the sum of operation speeds of the delay circuit 7, the NAND circuit 6d and inverters 5i, 5j and 5k. The address signal is as shown in FIG. 17(a), and the reset pulse signals P1 and RP2 are as shown in FIGS. 17(e) and (f), respectively. When the clock signal AP decreases to L level, the reset pulse signals RP1 and RP2 fall after a predetermined delay.

Figure 18:
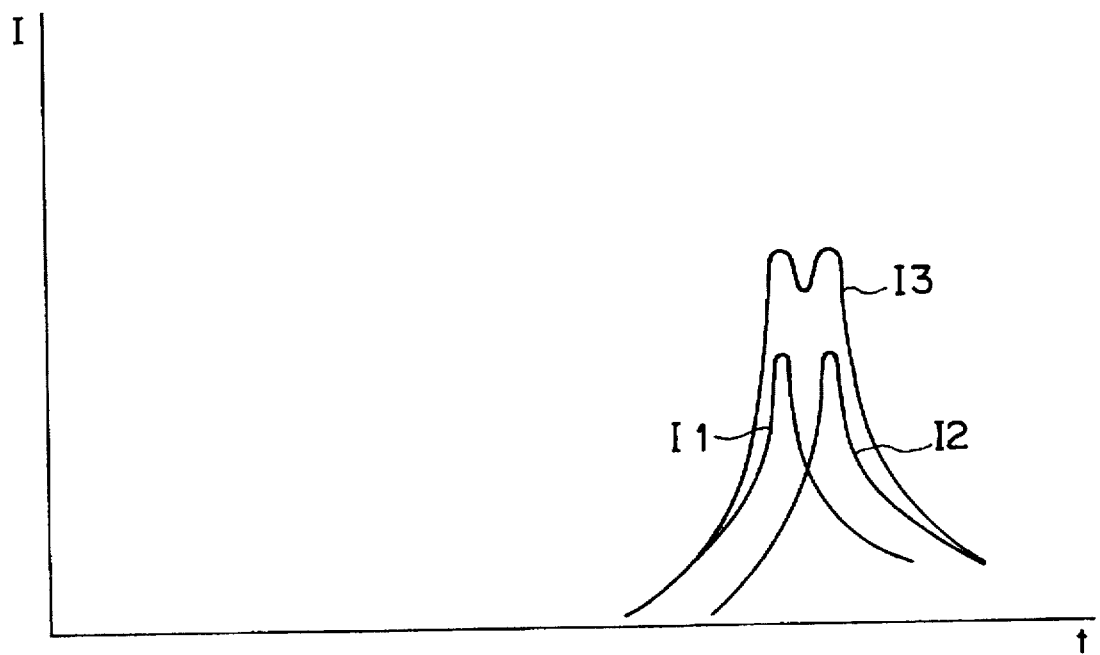
FIG. 18 is a graph illustrating signals passing through bit lines in the configuration shown in FIG. 13.
Figure 17C:
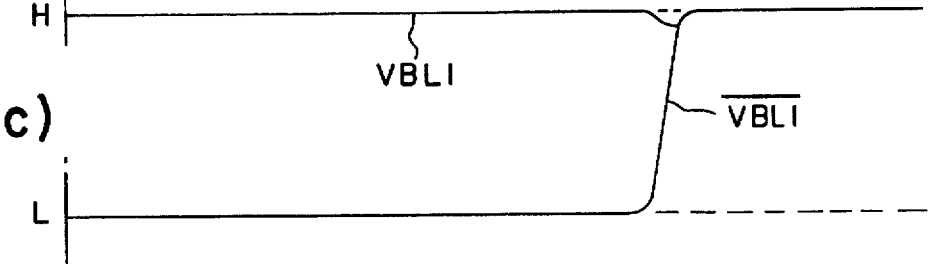
Figure 17D:
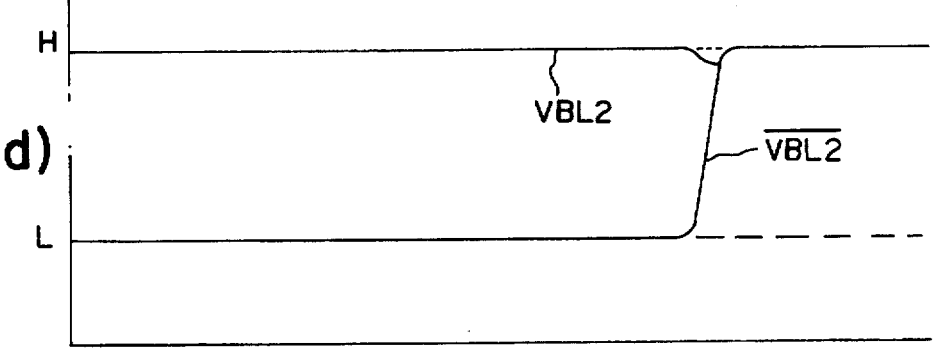

When the reset pulse signal RP1 rises to H level, a pair of bit lines BL1 and $\overline{BL1}$ of the column C1 shown in FIG. 13 is short-circuited and the potential $\overline{VBL1}$ of the bit line $\overline{BL1}$ rises as shown in FIG. 17(c). At the same time, a short-circuit current I1 shown in FIG. 18 passes through the bit line $\overline{BL1}$. After the reset pulse signal RP1 rises, the reset pulse signal RP2 rises to H level as shown in FIG. 17(f). In response to the rise of the reset pulse signal RP2, a pair of bit lines BL2 and $\overline{BL2}$ is short-circuited, and the potential $\overline{VBL2}$ of the bit line $\overline{BL2}$ increases to H level as shown in FIG. 17(d). At the same time, a short-circuit current I2 shown in FIG. 18 passes through the bit line $\overline{BL2}$. Thus, the short-circuit currents I1 and I2 pass at different timings so that a total short-circuit current I3 formed by the sum of the short-circuit currents I1 and I2 has a peak smaller than that of the peak current Ip shown in FIG. 11. It follows that a decrease of the power source voltage can be prevented.

Figure 19:
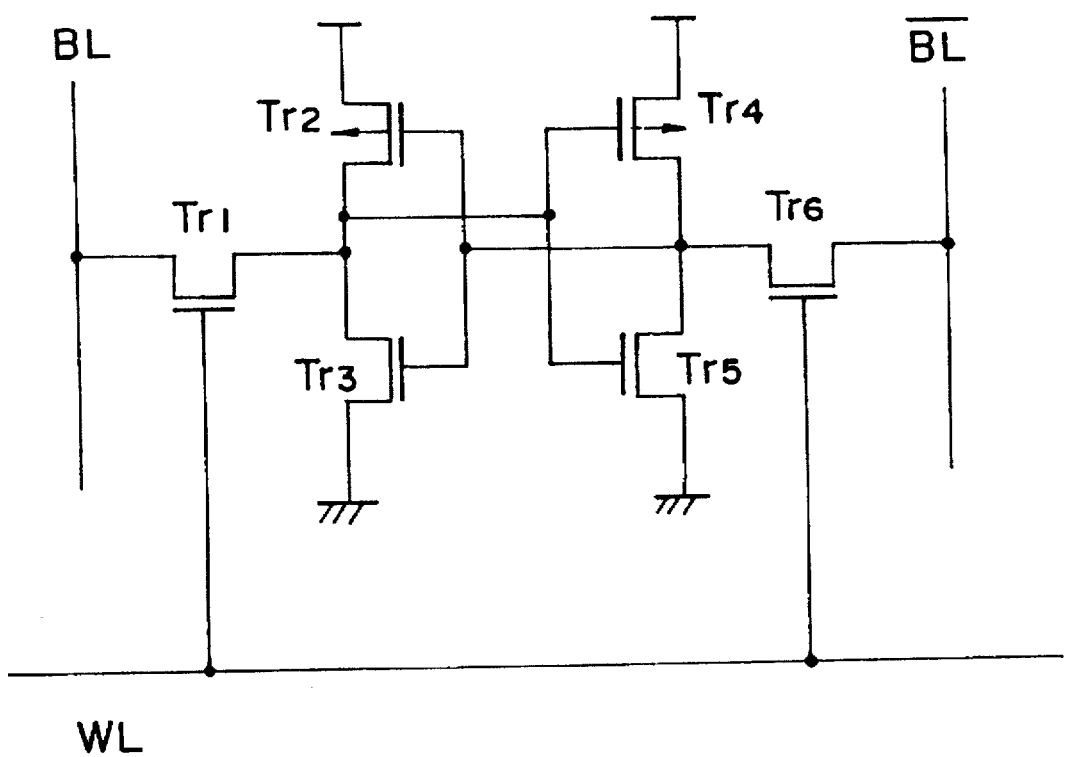
FIG. 19 is a circuit diagram of a memory cell provided in a memory cell array shown in FIG. 4.

FIG. 19 is a circuit diagram of the memory cell 22. The memory cell 22 is made up of six transistors Tr1 through Tr6 in a conventional manner.

The present invention is applicable to a SRAM in which bus lines are short-circuited before data read or write is executed.

The present invention is not limited to the aforementioned embodiments, and variation and modifications may be made without departing from the scope of the invention.

What is claimed is:

1. A semiconductor memory comprising:
   a memory cell array having a plurality of memory cells coupled to word lines and pairs of bit lines;
   address supply means, coupled to said memory cell array, for supplying said memory cell array with an address;
   clock generator means, coupled to said address supply means, for generating a clock signal in response to a transition of said address;
   data read/write means, coupled to said memory cell array, for reading data from said memory cell array and for writing data into said memory cell array;
   reset signal generating means, coupled to said clock generator means, for generating reset signals in response to said clock signal;
   reset means, coupled to said pairs of bit lines, for resetting the pairs of bit lines in response to said reset signals, said reset signals causing the reset means to reset the pairs of bit lines at different timings in order to prevent all of the pairs of bit lines from being simultaneously reset by said reset means; and
   power down pulse generating means, coupled to said clock generator means, said data read/write means, and said reset signal generating means, for generating a power down signal causing said data read/write means and said reset signal generating means to become inactive in response to said clock signal, said power down pulse generating means generating said power down signal at different timings with respect to receipt of said clock signal on the basis of whether said clock signal changes from a first level to a second level or changes from the second level to the first level to prevent the power down signal from being output twice when the clock signal has a pulse width shorter than a normal pulse width thereof.

2. The semiconductor memory as claimed in claim 1, wherein:
   the memory cells are grouped into a plurality of groups; and
   the pairs of bit lines within one of the plurality of groups are simultaneously reset by a corresponding one of the reset signals.

3. The semiconductor memory as claimed in claim 1, wherein:
   said reset signal generating means generates first and second reset signals;
   the reset means resets, in response to the first reset signal, one of the pairs of bit lines; and
   the reset means resets, in response to the second reset signal, another one of the pairs of bit lines at a timing different from that of the first reset signal.

4. The semiconductor memory as claimed in claim 3, wherein said one of the pairs of bit lines is adjacent to said another one of the pairs of bit lines.

* * * * *

UNITED STATES PATENT AND TRADEMARK OFFICE
CERTIFICATE OF CORRECTION

PATENT NO.: 5,719,812
DATED : February 17, 1998
INVENTOR(S): SEKI et al.

It is certified that error appears in the above-identified patent and that said Letters Patent is hereby corrected as shown below:

Column 4, line 1, delete "(d)" and insert therefor --(f)--.

Signed and Sealed this

Twenty-third Day of November, 1999

Attest:

Q. TODD DICKINSON

*Attesting Officer*          *Acting Commissioner of Patents and Trademarks*